PROCESS OF DOPING SEMICONDUCTOR WITH ANALYZING MAGNET

Filed Oct. 12, 1966

United States Patent Office 3,496,029

Patented Feb. 17, 1970

3,496,029

PROCESS OF DOPING SEMICONDUCTOR WITH ANALYZING MAGNET

William J. King, Reading, and Stanley J. Solomon, Lexington, Mass., assignors to Ion Physics Corporation, Burlington, Mass., a corporation of Delaware Continuation-in-part of application Ser. No. 280,587, May 18, 1963. This application Oct. 12, 1966, Ser. No. 596,364

Int. Cl. H01l 7/54, 15/02

U.S. Cl. 148—1.5 11 Claims

ABSTRACT OF THE DISCLOSURE

A process of doping a semiconductor using an analyzing magnet for passing only a monoatomic beam of ions through the magnet. The monoatomic beam irradiates the surface of the semiconductor. The semiconductor is then heated to repair bulk radiation damage created in the semiconductor by the monoatomic beam.

This invention is concerned with solar cells and their fabrication. More particularly, it relates to solar cells having very discrete PN junction profiles and to novel ion implantation techniques whereby such junction profiles are obtained.

This application is a continuation-in-part of a copending application Ser. No. 280,587 filed May 18, 1963, now abandoned.

As an auxiliary power source for space vehicles with long term missions, silicon solar cells are currently unrivalled. The primary advantages are relatively high efficiency, reliability, long lifetime, low weight, resistance to space environment and utilization of solar energy as primary power source. In spite of the good performance of these devices, certain improvements are achievable. Increased efficiency would reduce the weight and cost per kilowatt, while improved radiation resistance would result in better reliability and longer lifetimes.

Based upon a semi-empirical formulation, the theoretical maximum efficiency for silicon solar cells has been determined by P. Rappaport, RCA Review, 20, 1959, p. 373 as approximately 22%. Recently, a theoretical limit of approximately 30% has been derived by W. Shockley and H. J. Queisser, Journal of Applied Physics, 32, 1961, p. 510, by assuming that only radiative recombination mechanisms are active, as required by the principle of detailed balance. In practice, some of the recombination processes will be non-radiative and the true practical limit is probably between the two limits, perhaps 25%. Since the best commercial cells are 14% with good production lots being 8–10%, considerable improvement in efficiency can be expected with improved fabrication techniques. This is true even if the lower theoretical minimum efficiency is assumed. Another goal, directed towards reducing the cost/kw., is the development of a production technique yielding high efficiency cells without an extensive selection procedure.

It is a principal object of this invention therefore to provide a production method adapted to yield more efficient, uniform quality solar cells at the same or lower costs than current methods.

It is another object of this invention to provide a solar cell having a discrete PN junction profile whereby collection efficiency is greatly increased.

Because this invention may be extended to all types of semiconductor devices it is a further object of this invention to provide a production method adapted to yield more efficient uniform semiconductor devices of all kinds such as diodes and transistors.

Moreover another object of this invention is to provide semiconductor devices having features and characteristics hitherto unknown.

Broadly speaking these and other features, objects and advantages are obtained by implanting in a semiconductor body discrete isotopes of an impurity which is capable of modifying and varying the electrical characteristics of the implanted body or of regions thereof.

These, together with other objects and features of this invention will become more readily apparent from the following detailed description thereof when taken in conjunction with the accompanying drawings wherein.

The ion implantation technique for PN junction formation is capable of achieving higher efficiency cells in production quantities. Through "exact" control of fabrication variables a semi-empirical optimization of the important cell parameters is obtained. The major technical advantage of the ion implantation technique lies in the capability of accurately producing the required junction profile. The ability of accelerated particle techniques to accomplish this precise tailoring of the characteristics of a semiconductor layer lies in the property that energetic heavy ions have very discrete ranges in matter. By the use of a particle accelerator to produce these ions, it is possible to obtain not only discrete ranges but also highly accurate control of the ion energy, ion current, integrated beam current and beam distribution. In addition, ions with sufficient energy for implementation of this technique may be readily obtained.

Figure 1:
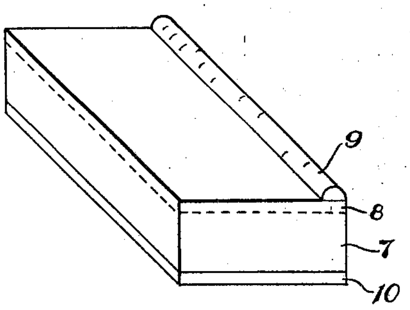
FIGURE 1 is an isometric view of a solar cell of the type comprehended by this invention.

Referring now to FIGURE 1, there is illustrated a typical ungridded configuration for a solar cell having a complete back surface contact 10 and a line front surface contact 9. Although both n on p cells and p and n cells are comprehended by this invention, for purposes of illustration the cell is shown as p on n, the body 7 being silicon and n-type and the surface layer 8, being doped with boron and p-type. Various other materials including germanium, GaAs, InP, CdTe, AlSb, and CdS variable band gap materials and other suitable geometric configurations are also intended to fall within the scope of this invention.

Figure 2:
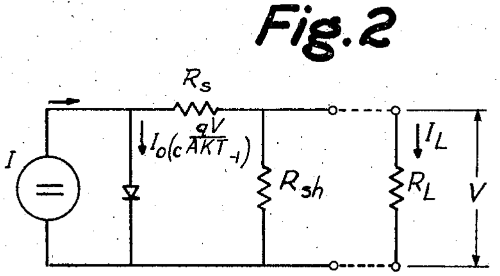
FIGURE 2 is an equivalent circuit of such a solar cell.

The equivalent circuit for the solar cell of FIGURE 1 is illustrated in FIGURE 2. The equation describing this equivalent circuit is:

$$I_L = I - I_0\left(e^{\frac{q}{A_kT}(V-IR_s)} - 1\right) - \frac{V}{R_{sh}}$$

where $I_L$=Load current
I=Light generated current
$I_0$=Reverse saturation current
A=Constant
$q$=Electronic charge
$k$=Boltzmann's constant
T=Temperature
V=Output voltage across load
$R_s$=Cell series resistance
$R_{sh}$=Cell shut resistance.

It has been calculated that a shunt resistance as low as 100 has no appreciable effect on the power output, while a series resistance of 1 ohm or more seriously affects cell performance. Consequently for most practical cases, the effect of shunt resistance may be neglected, but the effects of series resistance must be considered.

It can also be shown that for the case of appreciable series resistance, the maximum efficiency can be written $$n_{max}=Q(1-r)(1-e^{-ocl})(1-P_{RS})\frac{\lambda V_{mp}}{1+\lambda V_{mp}}\frac{qn_{ph}(Eg)V_{mp}}{N_{ph}E_{AV}}$$

where

Q=Collection efficiency
$r$=Reflection coefficient
$e^{-ocl}$=Fraction of incident radiation transmitted
$oc$=Absorption coefficient
$l$=Thickness of cell
$P_{RS}$=Fraction of output power dissipated in internal series resistance
$V_{mp}$=Voltage at maximum power point
$n_{ph}(Eg)$=Number of incident photons with energy greater than the semiconductor energy gap
$\lambda=q/AkT$
$N_{ph}$=Total number of photons in solar spectrum
$E_{AV}$=Average energy of solar photons.

The following discussion of the various factors in Equation 2 demonstrates the theoretical advantages of ion implantation techniques for solar cell fabrication and in part determines design parameters for the solar cell comprehended by this invention. It is noteworthy that the first two of the factors have basic physical limitations beyond which no improvement in efficiency is possible, while the latter three are technique influenced and offer increased efficiency with improved techniques.

Incomplete absorption is associated with the factor $(1-e^{ocl})$. Photons are absorbed in the cell by the intrinsic absorption process in which a hole-electron pair is created. Only those photons with energy greater than the silicon band gap of 1.2 ev. have sufficient energy to create such pairs. The remaining longer wavelength photons are wasted in the cell or transmitted.

Incomplete utilization of converted photon energy is associated with the expression $$\frac{\lambda_{mp}}{1+\lambda_{mp}}qn_{ph}(Eg)V_{mp}$$

If the incident photons have energy greater than the band gap, further energy is wasted since the excess energy is transferred to the semiconductor lattice in the form of heat. This loss may be ascribed to the solar spectrum since it would not occur if the incident light were monochromatic with energy equal to the band gap. Approximately 53% of the energy entering a silicon solar cell is lost in this manner and cannot be retrieved except by using higher band gap materials. For such materials there is an obvious tradeoff between this factor and the factor $(1-e^{oc})$. This factor is further complicated since there is a difference between the energy gap and the open circuit voltage. The open circuit voltage is determined by the difference between Fermi levels in the n- and p-regions adjacent to the junction. These Fermi levels normally lie within the forbidden band and the open circuit voltage is thus somewhat less than the energy gap (commonly .55 v. vs. 1.2 ev.).

Some of the light incident on the surface of a solar cell is reflected without entering the cell. This factor, represented by the expression $(1-r)$, is made negligible through production techniques. This is very important since the reflectivity of clean silicon is about 30% in the wavelength range of interest. It is possible to improve the short circuit current of silicon solar cells by more than 20% with antireflection coatings.

Incomplete collection of hole-electron pairs, that is the collection efficiency Q, is susceptible to improvement through the ion implantation techniques of this invention. In order to become separated and do external work, the generated hole-electron pairs must be created within a diffusion length $L=\sqrt{D_T}$ of the junction. This requires a large diffusion constant D and long lifetime $\tau$, typically 10 cm.$^2$/sec., *abd* 10 microseconds in the bulk region. Minority carriers which do not satisfy this condition may diffuse away from the junction and recombine at the surface or deep inside the cell. The collection efficiency, defined as the percentage of minority carriers which contribute to the current, is only 60% for a 9% cell. Incomplete collection therefore represents a very serious loss in efficiency in solar cells and more efficient collection leads not only to more efficient cells but, for an accurately controlled technique, to a higher "average" efficiency for production cells. Failure to collect all of the generated carriers occurs for two reasons. In the bulk region the main difficulty is with low lifetime occurring as the result of the production diffusion process which is carried out at temperatures above 1000° C. Diffusion of undesirable impurities at this temperature seriously reduces the lifetime. Since the ion implantation technique does not require high temperature, there is no loss of minority carrier lifetime in the n-region. Some loss in lifetime in the p-region may occur as the result of radiation damage, but the lifetime in diffusion type cells is also severely reduced in this region. In addition, it is possible to anneal out the radiation damage at temperatures low enough to have negligible effect on the bulk lifetime. Since the major contribution to the response is from the n-layer, some improvement in efficiency is achieved through lifetime improvement in the n-region.

In the surface p-region, the extremely high surface recombination velocity $s(>10^5$ cm./sec.) resulting from the manufacturing process produces a very low carrier lifetime ($<10^{-9}$ sec.), severely limiting p-layer response. Two possibilities for improving this situation exist. The first of these, a reduction in $s$, is extremely difficult to obtain in practice. An alternate solution is to provide some means of separating the hole-electron pairs so rapidly that there is insufficient time for recombination. A "built-in" drift field exists between the junction and the surface of the cell because of the large impurity gradient (FIGURE 3) resulting from heavy surface concentration and shallow junction depth. This field exists because there is a gradient of majority carriers due to the impurity gradient. A diffusion of majority carriers would occur unless an internal electric field were set up to restrain them. This field is so directed as to aid the flow of electrons in the p-layer to the junction, thereby effecting a separation of the holes and electrons.

To affect a significant reduction in surface recombination, this field would have to be of the order of $E=s/\mu\sim2\times10^3$ volts/cm. (assuming $s\sim2\times10^5$ cm./sec. and $\mu=100$ cm.$^2$/volt-sec.). The magnitude of this field may be determined from $$E=-\frac{kT}{q}\frac{1}{C(x)}\frac{dC}{dx}\text{ volts/cm.}$$

where $C(x)$=Impurity concentration at position $x$
$x$=Distance from surface of cell.

Figures 3, 4, 5:
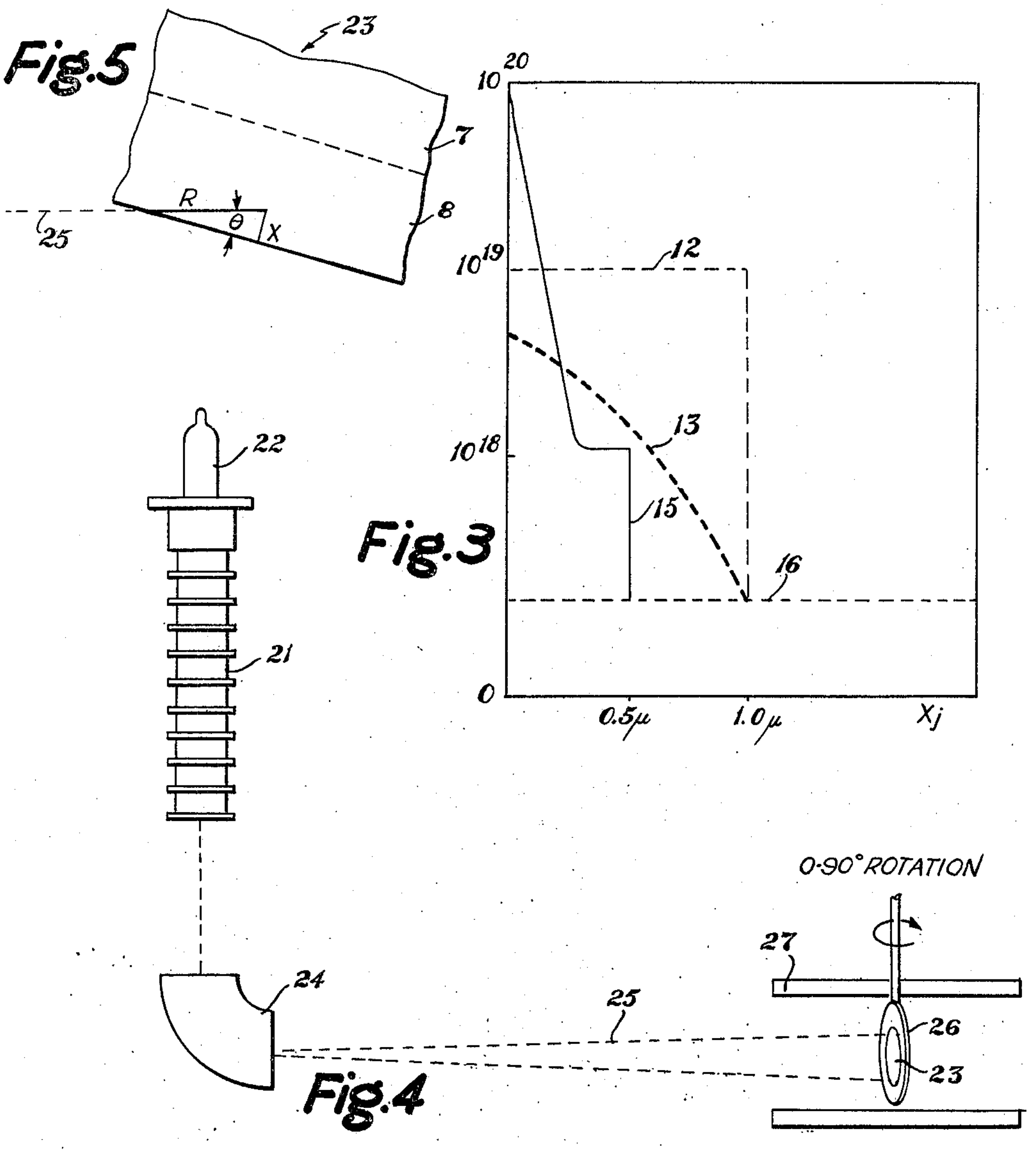
FIGURE 3 is a graph comparing the proposed optimum junction profile of the subject invention with alloy and diffusion junction profiles.
FIGURE 4 illustrates apparatus whereby the novel ion implantation techniques of this invention may be accomplished.
FIGURE 5 is a detail illustrating the angle of incidence of the ion beam on the semiconductor surface during the ion implantation process.

From FIGURE 3 it may be seen that the value of this field in diffusion produced cells, which have a complementary error function profile, as illustrated by curve 13 is such as to produce a more or less uniform field throughout the p-layer. This is not an optimized distribution. Carriers generated within a diffusion length of the junction diffuse to the junction and are swept away by the carrier field. They require no auxiliary field to avoid recombination. Carriers generated at the surface of the cell are subject to the very high surface recombination velocity and therefore the maximum drift field should occur at this point. The carrier concentration corresponding to an optimum field distribution is shown by curve 15 to FIGURE 3. Considerations on p-layer resistivity hereinafter described explain the reduced junction depth. The ion implantation technique is currently the only method of obtaining such a profile.

An estimate of the field obtained in diffusion type cells may be obtained by assuming that the impurity concentration is an exponential function of position rather than an error function. For this approximation $$E_{ave}(0.026/x_j)\ \ln\ (C_0/C_j)\ \text{volts/cm.}$$

where $E_{ave}$=Average effective field in region $0 \leq x \leq x_j$
$x_j$=Junction depth
$C_0$=Impurity concentration at surface
$C_j$=Impurity concentration at junction.

For typical values of $x_j=1$ micron; $C_0 \sim 10^{18}$ cm.$^{-3}$, $C_j \sim 10^{17}$ cm.$^{-3}$ this gives $E_{ave} \sim 1200$ volts/cm. and for $10^{20}$ cm.$^{-3}$, $E_{ave} \sim 1800$ volts/cm. perhaps enough to cause a significant increase in collection efficiency. Obtaining this latter surface concentration is extremely difficult with diffusion techniques. In addition, the effect of the corresponding field would be much less than for the optimum distribution which provides much higher fields at the surface.

Series resistance loss, $(1-P_{RS})$, is also a major factor in determining junction depth. In order to increase the collection efficiency, the junction should be as shallow as possible. This causes a larger percentage of the carriers to be generated in the n-region where the minority carrier lifetime is high. Also, minority carriers generated in the shallow p-layer are closer to the barrier field and have a higher probability of being swept into the n-region. However, as the junction depth is reduced the resistance of the p-layer increases for holes crossing the junction at points far from the contact. A compensating change can be made by increasing the impurity concentration in the p-layer, effecting a corresponding decrease in resistivity. The obtainable impurity concentration in the p-layer with the diffusion process (for boron in silicon) is less than $10^{19}$ cm.$^{-3}$ inside the surface to $10^{17}$ cm.$^{-3}$ at the junction (corresponding to bulk material with a resistivity of .4 ohm-cm.). This limits the junction depth to something of the order of 1 micron for maximum efficiency.

In theory, any number of impurity atoms may be inserted using ion implantation methods and $C_0$ might be made to approach the solid solubility limit of $10^{20}$ cm.$^{-3}$. The junction depth could then be reduced by a factor of 2 or 3. It can therefore be concluded that the impurity gradient yielding the optimum junction profile for maximum collection efficiency should have the following characteristics: It should provide a drift field of at least 2000 vol./cm. in the p-layer; this field should be concentrated at the cell surface where the recombination velocity is highest; and the junction depth should be as shallow as possible consistent with low p-layer resistivity.

Using the figure of $10^{20}$ cm.$^{-3}$ as the solid solubility limit for boron in silicon, the optimum junction profile 15 of FIGURE 3 is obtained. This is based on a minimum impurity concentration anywhere in the p-layer of $10^{18}$ cm.$^{-3}$ and a junction depth of .5 micron although the optimum cell may have a still shallower junction. A cell with this junction profile would have an active drift field at the surface of the cell of >4000 volts/cm. and a p-layer resistance of less than 5 ohms. Such a cell would evidence much higher collection efficiency in the p-layer and therefore an enhanced p-layer response. In addition, if this cell is being produced by ion implantation methods, the n-layer response will be improved by longer minority carrier lifetime.

Radiation damage will occur in the implanted region but primarily at the end of the ion range. The main energy loss mechanism for heavy charged particles in matter is the process of ionization. Elastic nuclear scattering becomes important only at the end of the range where the ions are moving slowly and for this reason, heavy ions have very discrete ranges.

At the end of the range where the damage is most severe, the process is one in which the heavy ions make elastic nuclear collisions with atoms in the lattice, giving them enough energy to displace them from their normal position. As a result, some of these atoms will take up interstitial positions and both interstitial and vacancy defects occur. These defects are semi-permanent, remaining in the crystal unless subsequent treatment (such as annealing) restores the lattice to the original condition. These primary defects have a high mobility in Si at room temperature and tend to associate with chemical impurities, particularly oxygen. It is possible for these defects to be "pinned" in by these chemical impurities. The result is the formation of energy levels in the forbidden gap which act as recombination centers for holes and electrons. Minority carrier lifetimes go down with a concomitant decrease in diffusion length and collection efficiency.

Such damage can be effectively annealed out at temperatures too low to have any effect on the bulk region lifetime or to cause significant boron diffusion. Investigations indicate that the annealing process is quite effective for boron radiation damage.

It has been found that such radiation damage can be annealed out at temperatures as low as 300° C. but annealing out radiation damage is alone not sufficient. It is also necessary that the implanted ions be moved from electrically inactive interstitial positions to electrically active substitutional positions in the crystal lattice and that such movement occurs for most implanted impurities at temperatures in the order of 500 to 750° C. Annealing at temperatures in excess of 750° C. is known to reduce the minority carrier lifetime of the semiconductor body. However for certain devices temperatures between 750° C. and 1000° C. are required for best results.

N on p cells have radiation resistance which is 3–5 times as great as p on n cells. The primary mechanism for loss of efficiency appears to be decrease of minority carrier lifetime in the base region since this leads to small diffusion length vis. $L=\sqrt{\tau D_T}$. Since the minority carriers in p-type material are electrons which have a diffusion constant approximately three times as great as holes, p-type base solar cells should be more resistant to radiation damage than n-type base cells. Another important consideration is that the lifetime of minority electrons decreases more slowly with radiation damage than the lifetime of minority holes, also leading to greater radiation resistance in p-type cells.

In FIGURES 4 and 5 the main components of the implantation apparatus comprehended by this invention are schematically illustrated. Using 2 mev. Van de Graaff electrostatic accelerator 21, boron ions from a suitable ion source 22 are accelerated to an energy of 350 kev., corresponding to a range in silicon of 0.5 micron. The ion beam 25 is deliberately defocussed uniformly to a cross-section larger than the area of semiconductor body 23 and is passed through analyzing magnet 24 to remove all impurities, yielding a spectroscopically pure beam. This beam then strikes 0.4 ohm-cm. n-type silicon semiconductor body 23 which is mounted in the target position in such a way that it can be rotated continuously from a position normal to the beam to a position parallel to the beam. Since the ions have a very discrete range independent of angle, the distance below the semiconductor surface at which the ions come to rest is determined by the angle viz.

$$X_p = R_{0.5}\sin\theta$$

where $X_p$=penetration depth perpendicular to surface
$R_{0.5}$=range of boron ions in silicon at 350 kev. (0.5 micron)
$\theta$=angle between incident direction and silicon surface.

By rotating the sample continuously while the beam energy is held constant a continuous implantation of ions is obtained from the surface to a depth corresponding to the maximum range. During the implantation the beam current is also held constant. Since the incident flux decreases as the angle between the incident direction and the cell surface decreases, a cam system is used to control the speed of sample rotation and therefore the integrated flux at any given depth below the surface.

Ion current may be controlled directly by two mechanisms, gas flow control and control of the potential on the electrode used to extract ions from the ion source. Each of these is subject to infinite resolution control over a broad range and together they allow operation of the machine at any desired ion density level in the range of interest. Implantation times are controlled by an automatic pneumatic valve which opens and closes in less than one fifth second.

As an example of the ion current and irradiation time requirements, consider a 1 cm.$^2$ cell with an impurity gradient of $10^{20}$ cm.$^{-3}$ at the surface of $10^{18}$ cm.$^{-3}$ at the junction .5 micron below the surface. This cell has an average impurity concentration of $10^{19}$ cm.$^{-3}$ and a total impurity number of $.5\times10^{-4}\times10^{19}=5\times10^{14}$. Since 1 microampere is $6\times10^{12}$ singly charged ions/sec., to implant the required impurity atoms requires a 1 microampere beam for $$\frac{5\times10^{14}}{6\times10^{12}}\approx 83 \text{ seconds}$$

or for 166 sec. for a 2 cm.$^2$ cell. Increasing the current decreases the irradiation time. The above is a rough calculation which assumes that all implanted ions take up lattice positions and that the ion flux remains constant as the sample is turned. The latter assumption in particular is not valid. For geometrical reasons the flux decreases by a factor of 100 as the angle between sample surface and beam direction changes from 90° to 5°. If the ion current is maintained constant, the differential irradiation time must be increased by a factor of 100 as the sample is turned, or an average factor of 50.

In practice, ion currents of 2–4 $\mu$amps have been used and irradiation times have varied from 15 minutes to 45 minutes. These long irradiation times are easily avoided and in fact can be made negligible by increasing the ion current.

This completes the description of the invention as it pertains to the production of solar cells. However, it should be obvious to workers skilled in the art that this invention can also be used to produce other semiconductor devices.

It is particularly important to point out that implantation beams having energies other than 350 kev. can be used. In practice ion beams whose energies ranged from 60 kev. to 2 mev. are also useful. The use of ion beam energies of 60 kev. and up is absolutely necessary to the success of the present invention since the use of ion beams below this level causes surface sputtering and mechanical damage to the device surface. Sputtering, which is the removal of material from the surface of the irradiated body, occurs either through direct expulsion of atoms or by momentum transfer along a chain of atoms. This sputtering thus causes a constant erosion of the surface such that any ions implanted below the surface such as the ions which cause momentum transfer are soon exposed and, in turn, removed. In any event such low energy ions cause mechanical working of and damage to the surface which creates mechanical defects such as dislocations and the like which cannot be removed from the semiconductor body. Such defects prohibit the realization of devices which are useful or worthwhile.

The present inventors have however found that if the ion energies are, for boron, in excess of 60 kev., that the sputtering is eliminated and that for most devices and ion beams, energies in the hundreds of thousands of electron volts or millions of electron volts are required for meaningful and significant penetration. Thus the present example used the value of 350 kev.

The reason higher energy beams do not cause sputtering is because the high energy ion is nuclearly stopped so deep within the body being implanted that the atoms affected at its stopping point do not receive sufficient energy to penetrate the intervening material and leave or to eject, by energy transfer, an atom from the surface.

It is also important to stress at this time that the success of the present invention also requires that the ion beam contain but one elemental species. That is the beam must be monatomic. The present invention accomplishes this through the use of the analyzing magnet 24 which removes from the beam all ions except the particular ions to be implanted.

As early as 1954 various workers suggested that monoenergetic ion beams might be utilized to produce semiconductor devices by ion implantation. As late as 1961 workers were still attempting to follow this suggestion with no success. All these prior art attempts failed to realize the expected results because they relied on monoenergetic beams and failed to remove from the beam all ions except those of the selected elemental species. That is they did not recognize the important of making the beam monatomic and relied only on making the beam monoenergetic. A report of such results is contained in a technical documentary by Westinghouse Corporation prepared under Contract AF 33(616)–7715. This report is numbered ASD–TDR–62–428 dated May 1962 and is available from the Armed Services Technical Information Agency.

It was not until the present inventors discovered that the beam had to be monatomic in addition to having an energy above 60 kev. that such ion implantation production of semiconductor devices became a reality.

Although the specific embodiment described the rotation of the semiconductor slice being implanted one skilled in the art will now readily appreciate that the same distribution of ions can be obtained in the implanted region by varying the beam energy, flux and dwell time. Realizing, of course, that at all times the minimum beam energies must be above the sputtering levels. Thus the solar cell of the described specific embodiment could be produced by reducing the ion beam energy from 350 kev. to 100 kev. in 50 kev. steps. It should of course be understood that any other conductivity determining impurity could be used and that the invention is not limited to the use of boron. The usual conducivity type impurities for semiconductor materials for silicon or germanium is found in either the Group III or Group V elements. Moreover the invention can also be used to dope semiconductor materials such as the so-called III–V compounds.

It is to be understood that the above described techniques and components are illustrative of the principles of this invention. Numerous variations thereof may be devised by those skilled in the art without departing from the scope of the invention.

Having thus described the invention, what is claimed as new and desired to be secured by Letters Patent is:

1. The process of doping a semiconductor body with a discrete conductivity type determining material comprising the steps of ionizing said material, accelerating the ions produced by said ionizing step to a predetermined velocity sufficient to enter said body, passing said accelerated ions at said predetermined velocity through an analyzing magnet, orienting said analyzing magnet so as to pass only a monatomic beam of said ions through said analyzing magnet while simultaneously removing any other ions from said beam, and wherein said velocity remains substantially constant throughout said magnet, irradiating a surface of said semiconductor body with said monatomic beam to implant said ions in said body, varying the character of said irradiation to effect controlled dispersement of said ionized material between the level of deepest penetration thereof and said irradiated surface and heating said body to repair bulk radiation damage created in said body by said beam and to move said implanted ions from conductively inactive interstitial positions to conductively active substitutional positions.

2. The process of claim 1 wherein said controlled dispersement of ionized material effects a concentration gradient between said surface and said level of deepest penetration having a maximum concentration at said surface and a concentration of not more than $10^{18}$ cm.$^{-3}$ at said level of deepest penetration which does not exceed 0.5 micron.

3. The process of claim 1 wherein the dispersement of said ionized material is controlled by maintaining said beam on said surface for a predetermined period of time and by means for varying the angle of incidence between the irradiated surface of said semiconductor body and said beam while maintaining the flux of said beam impinging on said surface at a constant value.

4. The process of claim 1 wherein the dispersement of said ionized material is controlled by maintaining said beam on said surface for a predetermined period of time and by varying the energy of said beam, said beam energy being greater than 60 kev.

5. The process of claim 1 wherein said heating raises the temperature of said body to between 500° C. and 750° C.

6. The process of claim 1 wherein said heating raises the temperature of said body to between 500° C. and 1000° C.

7. The process of claim 1 wherein said ions are accelerated to an energy sufficient to enter said body without causing surface erosion of said body.

8. The process of claim 1 wherein said ions implanted in said body are of a conductivity type and in sufficient numbers to produce a P-N junction in said body.

9. The process of claim 1 wherein said ions are implanted in said body in sufficient numbers to vary the resistivity of said body without changing the conductivity type of said implanted body.

10. The process of claim 9 wherein said ions are of a conductivity type opposite to the conductivity type of said body.

11. The process of claim 9 wherein said ions are of a conductivity type identical to the conductivity type of said body.

References Cited

UNITED STATES PATENTS

| | | | |
|---|---|---|---|
| 2,666,814 | 1/1954 | Shockley | 148—1.5 |
| 2,750,541 | 6/1955 | Ohl | 148—1.5 |
| 2,787,564 | 4/1957 | Shockley | 148—1.5 |
| 2,842,466 | 7/1958 | Moyer | 148—1.5 |
| 2,858,441 | 10/1958 | Gale | 204—154 |
| 2,860,251 | 11/1958 | Pakswer et al. | 204—154 |
| 2,949,498 | 8/1960 | Jackson | 136—89 |
| 2,993,945 | 7/1961 | Hurth | 136—89 |
| 3,081,370 | 3/1963 | Miller | 136—89 |
| 3,131,300 | 4/1964 | Jeter et al. | |
| 3,135,863 | 6/1964 | Hunt. | |
| 3,206,336 | 9/1965 | Hora | 148—1.5 |
| 3,294,583 | 12/1966 | Fedows-Fedotowsky. | |
| 3,322,575 | 5/1967 | Ruehrwein | 136—89 |

FOREIGN PATENTS

| | | |
|---|---|---|
| 779,190 | 7/1957 | Great Britain. |

OTHER REFERENCES

Maguire: Electronics, Apr. 19, 1963, pp. 26, 27 and 29.

Wallmark, J. T.: Proc. of the I.R.E., April 1957, pp. 474–483.

Wolf, M.: Proc. of the I.R.E., May 1963, pp. 674–688.

Wolf, M.: Proc. of the I.R.E., July 1960, pp. 1246 and 1254–61.

Rourke, F. M. et al.: Crystal "Doping" by Ion Bombardment, in Rev. Sci. Instr., 32, 455, 456, 1961.

ALLEN B. CURTIS, Primary Examiner

U.S. Cl. X.R.

117—93.3; 136—89; 148—189